United States Patent [19]
Mizuta et al.

[11] Patent Number: 6,100,571
[45] Date of Patent: Aug. 8, 2000

[54] FET HAVING NON-OVERLAPPING FIELD CONTROL ELECTRODE BETWEEN GATE AND DRAIN

[75] Inventors: Masashi Mizuta; Masaaki Kuzuhara; Yasunobu Nashimoto; Kazunori Asano; Yosuke Miyoshi; Yasunori Mochizuki, all of Tokyo, Japan

[73] Assignee: NEC Corporation, Tokyo, Japan

[21] Appl. No.: 09/326,702

[22] Filed: Jun. 7, 1999

[30] Foreign Application Priority Data

Jun. 16, 1998 [JP] Japan ................................. 10-168602

[51] Int. Cl.$^7$ .................................................. H01L 27/095
[52] U.S. Cl. ............................................ 257/488; 257/260
[58] Field of Search .................................. 257/280, 284, 257/409, 488, 260

[56] References Cited

U.S. PATENT DOCUMENTS

| | | | |
|---|---|---|---|
| 4,047,199 | 9/1977 | Kataoka et al. | 257/488 |
| 5,399,886 | 3/1995 | Hasegawa | 257/192 |
| 5,872,369 | 2/1999 | Inokuchi | 257/409 |

FOREIGN PATENT DOCUMENTS 9-232827  9/1997  Japan .

*Primary Examiner*—David Hardy
*Attorney, Agent, or Firm*—Foley & Lardner

[57] ABSTRACT

A field control electrode 9 is formed over an insulating film 6 on a channel layer 2, between a gate electrode 5 and a drain electrode 8. Tantalum oxide ($Ta_2O_5$), for example, may be used as the material for the insulating film 6.

20 Claims, 10 Drawing Sheets

GATE ELECTRODE SIDE

DRAIN ELECTRODE SIDE

OPENING (HOLE)

FET HAVING NON-OVERLAPPING FIELD CONTROL ELECTRODE BETWEEN GATE AND DRAIN

BACKGROUND OF THE INVENTION

1. Field of the Invention

The present invention relates to a Schottky gate field effect transistor that operates in the microwave region used for mobile communication, satellite communication, satellite broadcasting and the like.

2. Description of the Prior Art

In comparison with Si, compound semiconductors are known to have high electron mobilities. For example, the electron velocity of GaAs is approximately 6 times in the low electric field and 2~3 times in the high electric field as fast as that of Si. Such characteristics of high-speed electrons have been put to good use in developing applications thereof to high-speed digital circuit elements or high-frequency analog-circuit elements.

In a field effect transistor (referred to as 'FET' in appropriate place, hereinafter) using a compound semiconductor, however, a gate electrode makes a Schottky junction with a channel layer of a substrate so that the electric field centers on a lower end (a circled field-centered section 30 in FIG. 12) of the gate electrode on the drain side, which may cause breakdown. This is a matter of great concern especially for a high-output FET that necessitates large signal operations.

Accordingly, numerous attempts have been hitherto made to prevent this field centralization on the edge section of the gate electrode on the drain side and improve withstanding voltage characteristics. As one example, there is known a technique to utilize a recess structure or an offset structure.

Further, another technique which raises the withstanding voltage is described in Japanese Patent Application Laid-open No. 232827/1997. This technique relates to an FET composing a switching circuit, wherein, as shown in FIG. 11, a cover electrode 20 is formed to cover a gate electrode and the electric potential of this cover electrode 20 is controlled to achieve improvement in characteristics of withstanding voltage.

Nevertheless, conventional techniques described above have the following problems, respectively.

In case of the FET having a recess structure or an offset structure, although a certain degree of improvement in characteristics of withstanding voltage can be attained, it is difficult to reach the standard currently required for characteristics of withstanding voltage with such means alone.

Further, the FET disclosed in Japanese Patent Application Laid-open No. 232827/1997 is originally designed for the purpose of use in switching circuits as mentioned in Claims therein. Therefore, differing from the FET for the use of amplifier circuits or oscillation circuits, this FET does not have a structure appropriate to obtain good high-frequency characteristics. This point is further described below.

In the FET disclosed in the above publication, a cover electrode spreads from a section above a gate electrode to a section above a drain electrode, as shown in FIG. 11. This generates a large parasitic capacitance between a channel layer and the cover electrode, which, in turn, lowers the operating speed and worsens high-frequency characteristics.

Further, because the gate electrode 5 and the cover electrode 20 overlapping each other, as seen in FIG. 11, are kept at the same electric potential, another parasitic capacitance 21 is generated between the cover electrode and the drain electrode, contributing to further impairment of high-frequency characteristics. This point is further described below.

The current gain cutoff frequency $f_T$ for an FET of this type is given by Equation (1), $$f_T = g_m/2p(C_g + C_p) \tag{1}$$

where $g_m$ is the mutual conductance, $C_g$ is the gate electrode capacitance and $C_p$ is the parasitic capacitance under the cover electrode (the field control electrode). In the prior art disclosed in the above publication, the value of the parasitic capacitance 21 is large so that the current gain cutoff frequency $f_T$ becomes small. Further, $f_T$ herein is proportional to the maximum frequency of oscillation $f_{max}$ (Equation (2)).

$$f_{max} f_T \tag{2}$$

Therefore, as $C_p$ increases, the value of the maximum frequency of oscillation $f_{max}$ decreases and consequently applicable frequencies become limited to a lower range.

The conventional techniques, thus, have difficulty in preventing the field centralization and raising withstanding voltage while maintaining good high-frequency characteristics.

Accordingly, an object of the present invention is to provide a field effect transistor having both high withstand voltage characteristics and excellent high-frequency characteristics.

SUMMARY OF THE INVENTION

In light of the above problems, the present invention provides a field effect transistor having a semiconductor substrate with a channel layer being formed on its surface, a source electrode and a drain electrode being formed at a distance on said semiconductor substrate, and a gate electrode being placed between said source electrode and said drain electrode, said gate electrode making a Schottky junction with said channel layer, a field control electrode being formed over an insulating film on said channel layer, between said gate electrode and said drain electrode. The field control electrode herein may be connected with the gate electrode and kept at the same electric potential, though it may be set independently at a different potential from that of the gate electrode.

The field control electrode has a function to end the electric flux line starting from ionized donors. Therefore, by setting a field control electrode, the field centralization which develops on the edge section of the gate electrode on the drain side is made to relax and spread over and characteristics of withstanding voltage are improved. Furthermore, since no part of the field control electrode of the present invention overlaps the gate electrode or the drain electrode, such a problem of parasitic capacitance between the field control electrode and the drain electrode as the prior art has does not arise.

Further, the present invention provides a field effect transistor having a semiconductor substrate with a channel layer being formed on its surface, a source electrode and a drain electrode being formed at a distance on said semiconductor substrate, and a gate electrode being placed between said source electrode and said drain electrode, said gate electrode making a Schottky junction with said channel layer, a sub electrode being formed over an insulating film on said channel layer, between said gate electrode and said source electrode.

In such an FET with a sub electrode, by applying a positive voltage to the sub electrode, it is possible to lower the resistance of the element and, hence, achieve higher efficiency. The sub electrode may be connected with the drain electrode.

Further, the field effect transistor of the present invention may have a structure wherein, in addition to the sub electrode, one or more field control electrodes are formed over the insulating film on said channel layer, between said gate electrode and said drain electrode. In the FET of this structure, the application of different voltages to respective electrodes such as the application of a positive voltage to the sub electrode and a negative voltage to the field control electrode can bring about a higher withstanding voltage, together with a higher efficiency. In the FET of this structure, the sub electrode is preferably connected with the drain electrode and the field control electrode, with the gate electrode.

In the FET according to the present invention, because the field control electrode is formed between the gate electrode and the drain electrode, the field centralization on the edge section of the gate electrode on the drain side is made to relax and characteristics of withstanding voltage are improved, while excellent high-frequency characteristics are maintained.

Further, the formation of a sub electrode between the gate electrode and the source electrode can effect a lower resistance of the channel layer directly under the sub electrode as well as a higher efficiency of the element.

DETAILED DESCRIPTION OF THE INVENTION

Figure 1:
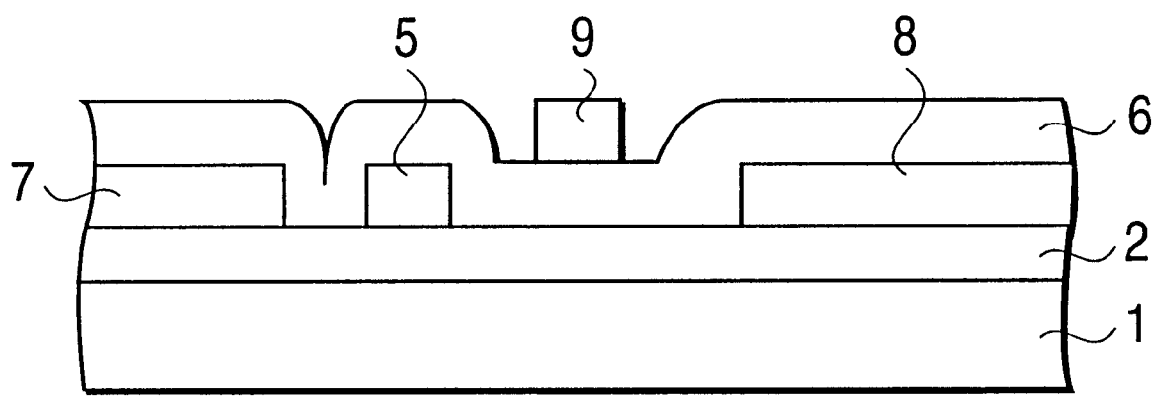
FIG. 1 is a schematic cross-sectional view showing a field effect transistor in accordance with the present invention.

The width of a field control electrode in the present invention can be preferably 0.1 $\mu$m or more and still more preferably above 0.1 $\mu$m and below 2 $\mu$m. Using such a range for the width, characteristics of withstanding voltage can be improved, while good high-frequency characteristics are maintained. Further, the thickness of an insulating film directly under the field control electrode can be preferably 10~1000 nm and still more preferably 100~300 nm. If the insulating film is too thick, the effect on the field relaxation is reduced. On the other hand, the excessive thinness of the insulating film may result in breakdown of the insulating film or leakage of the current.

In the field effect transistor of the present invention, the electrostatic capacitance per unit area of a system which consists of the field control electrode, a channel layer and the insulating film sandwiched between these is preferably larger on the side of a gate electrode than on the side of a drain electrode. Such an arrangement moderates the effect of the field control electrode on the drain side and facilitates to achieve the ideal field profile. Consequently, characteristics of withstanding voltage can be improved effectively with deterioration of high-frequency characteristics being kept down to the minimum.

Now, the magnitude of the above-mentioned electrostatic capacitance C is given by Equation (3).

$$C = \epsilon S/d \quad (3)$$

(C: the capacitance, $\epsilon$: the dielectric constant, S: the area of electrode, d: the distance between electrodes) Therefore, as the structure of the field effect transistor as described above, there can be considered structures in which one of those among the distance between electrodes d, the area of the electrode S and the dielectric constant $\epsilon$ is varied with distance from the gate electrode. The following is field effect transistors realized in this way.

(i) A field effect transistor wherein the thickness of an insulating film directly under a field control electrode is less on the side of a gate electrode than on the side of a drain electrode.

In this structure, the change in the electrostatic capacitance is achieved by varying the distance between electrodes d.

(ii) A field effect transistor wherein one or more openings are formed in a section of a field control electrode on the side of a drain electrode.

In this structure, the change in the electrostatic capacitance is achieved by varying the area of electrode S. An example of a field control electrode in such a structure is shown in FIG. 5(c). 'An opening' in this structure is a hole made through the field control electrode and may have any shape, Further, 'a section of a field control electrode on the side of a drain electrode' is a section of a field control electrode along the edge thereof on the drain side, when seen from above, as in FIG. 5(c).

(iii) A field effect transistor wherein the edge section of a field control electrode on the side of a drain electrode is comb-shaped.

In this structure, the change in the electrostatic capacitance is achieved by varying the area of electrode S. The form referred to as 'comb-shaped' herein is an intricate form the edge section of the field control electrode takes, for instance, in FIGS. 5(a) and (b). These examples shown in the drawings, however, are given to illustrate the invention and not to limit the scope of the invention and any intricate form the edge section takes may be used as long as the actual area of the electrode is reduced on the side of the drain electrode.

(iv) A field effect transistor wherein the dielectric constant of an insulating film directly under a field control electrode decreases with distance from a gate electrode.

In this structure, the change in the electrostatic capacitance is achieved by varying the dielectric constant $\epsilon$.

Further, in the field effect transistor of the present invention, the insulating film may be a high dielectric film selected from the group consisting tantalum oxide ($Ta_2O_5$), strontium titanate ($SrTiO_3$), barium titanate ($BaTiO_3$), barium titanate strontium ($Ba_xSr_{1-x}TiO_3$ ($0<x<1$)) and bismuth tantalate strontium ($SrBi_2Ta_2O_9$). With such high dielectric film, the insulating film can have a certain thickness so that breakdown of the insulating film or leakage of the current can be prevented. When the insulating film is made of one of the above materials, the thickness thereof can be preferably 50~1000 nm and still more preferably 100~300 nm. Using such range for the thickness, characteristics of withstanding voltage can be improved, while good high-frequency characteristics are maintained.

In the field effect transistor of the present invention, float electrode (floating gate) may be set under the field control electrode. In this arrangement, electrons are kept in the float electrode even when the applied voltage to the field control electrode is switched off and, in consequence, the field centralization on the edge section of the gate electrode on the drain side is relaxed and spread out.

In the field effect transistor of the present invention, a plurality of field control electrodes rather than a single one may be set, which can make relaxation of the field centralization more effective. In this case, voltages applied to respective field control electrodes can be the same or different. For instance, all of the field control electrodes may be connected with the gate electrode and set at the same potential. On the other hand, it may be arranged in such a way that the nearest to the gate electrode among a plurality of those field control electrodes is at the same potential as the gate electrode and a part or all of the rest are at the same potential as a source electrode. This arrangement can reduce the capacitance between the gate and the drain. Further, the voltage applied to a plurality of field control electrodes may be changed dynamically.

Further, in the case that a plurality of field control electrodes are set, the dielectric constants of the insulating film directly under respective field control electrodes may be arranged to decrease with distance from the side of the gate electrode. Such an arrangement moderates the effect of the field control electrode on the drain side and facilitates to achieve the ideal field profile. Consequently, characteristics of withstanding voltage can be improved effectively, yet deterioration of high-frequency characteristics is kept down to the minimum.

In the field effect transistor of the present invention, it is preferable that a distance between the gate electrode and the drain electrode is longer than a distance between the gate electrode and the source electrode. This structure is often referred to as an offset structure and can relax and spread over the field centralization on the edge sect ion of the gate electrode on the drain side more effectively. Moreover, from manufacturing point of view, this structure has the advantage of relative easiness in forming the field control electrode. Further, the field effect transistor of the present invention preferably has a recess structure, by which the field centralization on the edge section of the gate electrode on the drain side can be relaxed and spread over more effectively.

In the field effect transistor of the present invention, a group III–V compound semiconductor such as GaAs may be utilized as a material to constitute a substrate or a channel layer. The group III–V compound semiconductors include GaAs, AlGaAs, InP, GaInAsP and the like. Using a material of a group III–V compound semiconductor, the high-speed high-output field effect transistor can be produced.

The field effect transistor of the present invention may be used, for instance, as a composing element of an amplifier circuit or an oscillation circuit. Because excellent high-frequency characteristics are required, in particular, for such a purpose, the characteristics of the FET of the present invention serve most fittingly.

Referring to the drawings, the preferred embodiments of the present invention are further described in detail below.

First Embodiment

Figure 11:
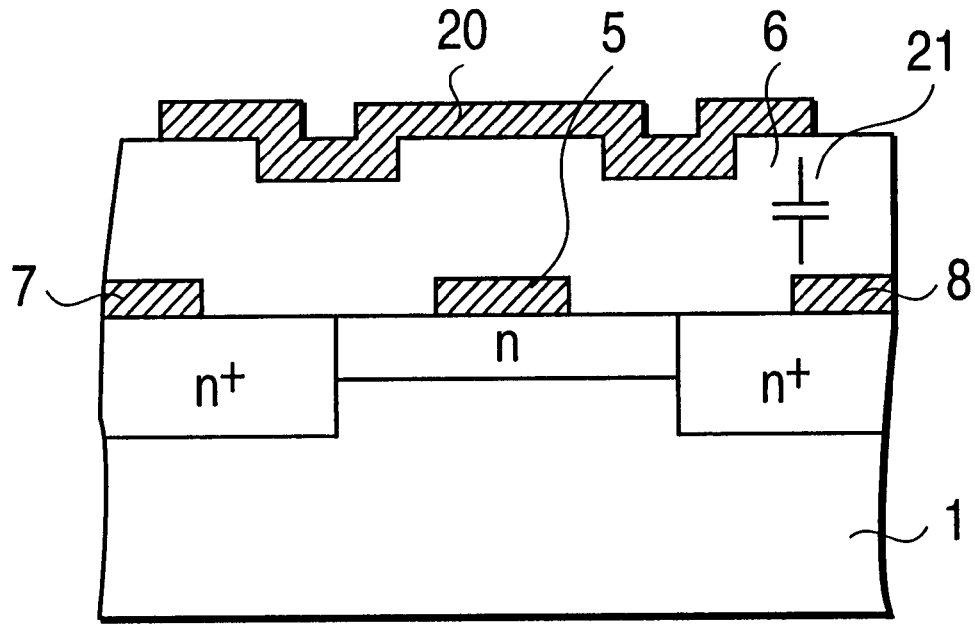
FIG. 11 is a schematic cross-sectional view showing a conventional field effect transistor.
Figure 12:
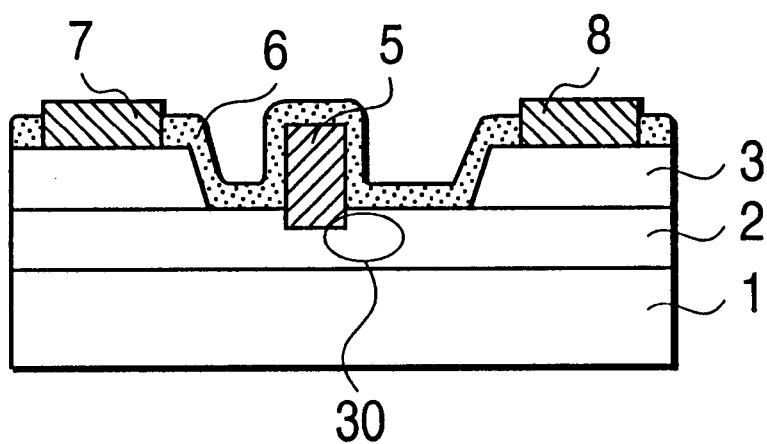
FIG. 12 is a schematic cross-sectional view illustrating the field centralization on a lower end of a gate electrode in a conventional field effect transistor.

The first embodiment is shown in FIG. 1. The first embodiment is an example in which a field control electrode 9 is formed over an insulating film 6 on a channel layer 2, between a gate electrode 5 and a drain electrode 8. The gate electrode 5 is placed between a source electrode 7 and the drain electrode 8, making a Schottky junction with the channel layer 2. The field control electrode 9 is formed, as shown in the drawing, in a region between the gate electrode 5 and the drain electrode 8 where neither of these electrodes are included. In other words, the field control electrode 9 is formed so as not to overlap the source electrode 7 or the drain electrode 8. By setting this field control electrode 9, the field centralization which develops on a lower end of the gate electrode 5 is made to relax and spread over and characteristics of withstanding voltage are improved. Furthermore, since no part of the field control electrode 9 overlaps the gate electrode 5 or the drain electrode 8, such a problem of parasitic capacitance under the field control electrode 9 as the prior art of FIG. 11 has does not arise.

With regard to the material for the field control electrode 9, for instance, tungsten silicide (WSi), aluminium, gold, titanium/platinum/gold or the like can be utilized.

The field control electrode can be formed, for instance, by a method in which a metal film is applied to the entire surface by means of vapour deposition and thereafter superfluous sections are removed by ion-milling with a photoresist serving as a mask.

This particular example has a so-called offset structure and a distance between the gate electrode 5 and the drain electrode 8 is longer than a distance between the gate electrode 5 and the source electrode 7. With such a structure, the field centralization on a lower end of the gate electrode 5 is made to relax more effectively. Further, from manufacturing point of view, this structure has the advantage of relative easiness in forming the field control electrode 9.

Second Embodiment

Figure 3F:
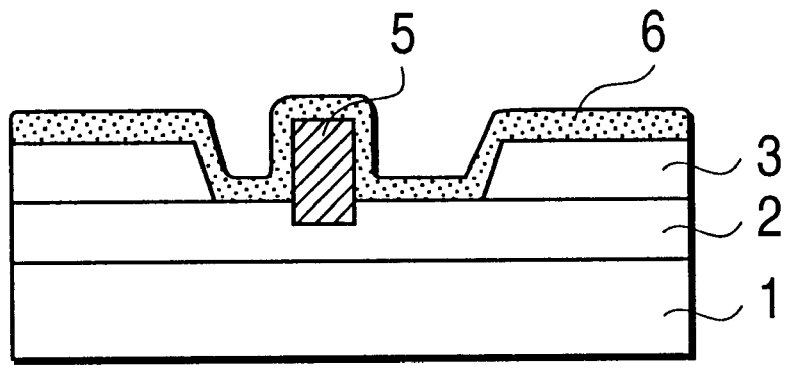
FIG. 3 is schematic cross-sectional views illustrating in sequence the further steps of the manufacturing method of the field effect transistor in accordance with the present invention.
Figure 3G:
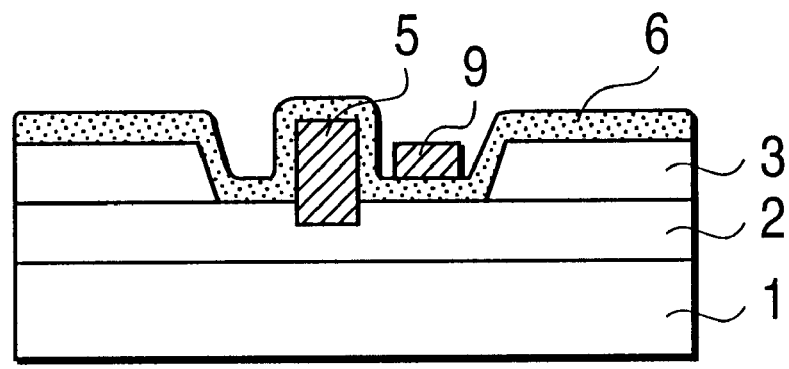
Figure 3H:
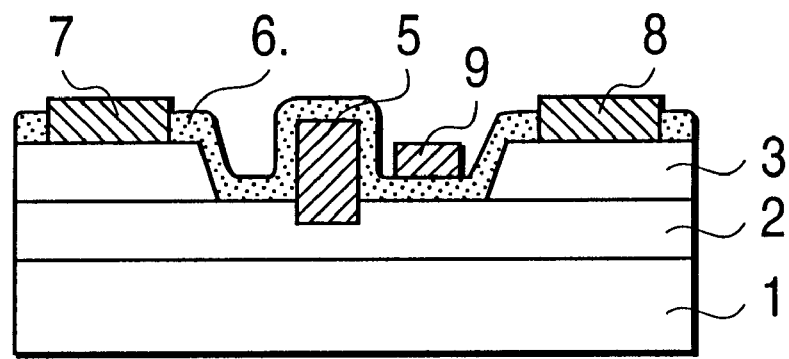

An example of an FET having a recess structure is shown in FIG. 3(h). A source electrode 7 and a drain electrode 8 are both formed to make ohmic contacts with a contact layer 3.

The recess structure also contributes to relax the field centralization on a lower end of the gate electrode 5. Therefore, when a field control electrode 9 is formed in an FET with a recess structure, the multiplication effect of the recess structure and the field control electrode 9 makes the field centralization relax and spread over still more effectively and characteristics of withstanding voltage are improved.

Further, while the embodiment shown herein is the one with a two-stage recess, a one-stage recess with the recess directly under the gate electrode being removed may be used in structure.

Third Embodiment

Figure 4:
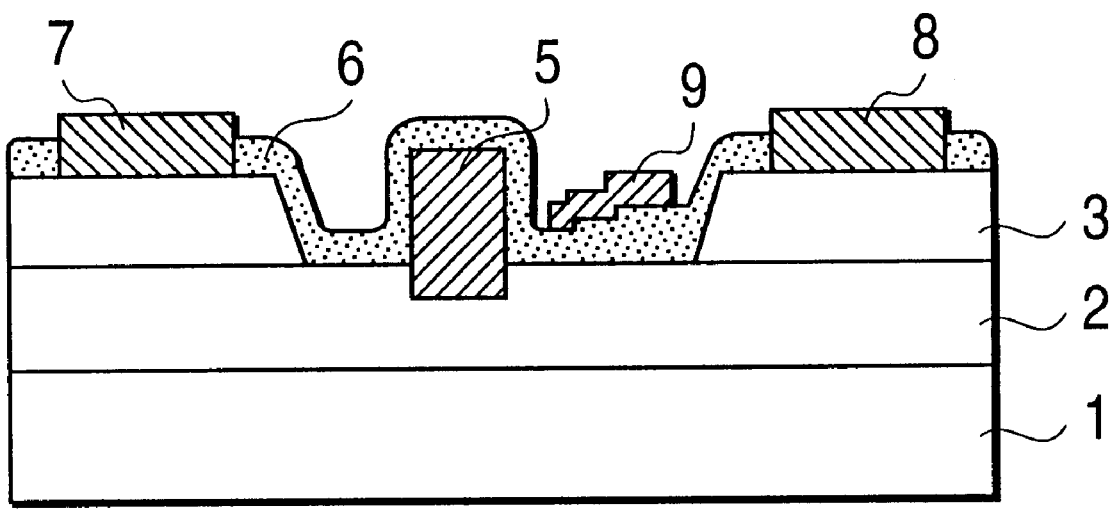
FIG. 4 is a schematic cross-sectional view showing another field effect transistor in accordance with the present invention.

The third embodiment is shown in FIG. 4. In this embodiment, a field control electrode 9 is formed on a stepped insulating film 6. The thickness of the insulating film 6 directly under the field control electrode 9 is less on the side of a gate electrode 5 than on the side of a drain electrode 8. As a result, the electrostatic capacitance per unit area of a system which consists of the field control electrode 9, the surface of a substrate and the insulating film 6 sandwiched between these is larger on the gate side than on the drain side. This makes the field centralization which develops on a lower end of the gate electrode 5 relax and spread over more effectively and improves characteristics of withstanding voltage further.

Fourth Embodiment

Figure 5:
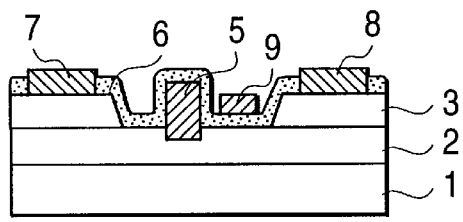
FIG. 5 is a schematic cross-sectional view showing another field effect transistor in accordance with the present invention, together with a group of schematic top plan views showing sections of various field control electrodes thereof.
Figure 5A:
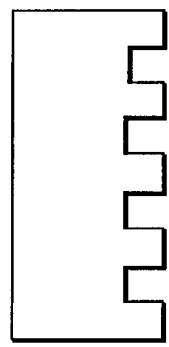
Figure 5B:
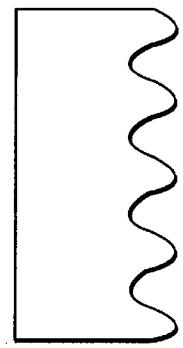
Figure 5C:
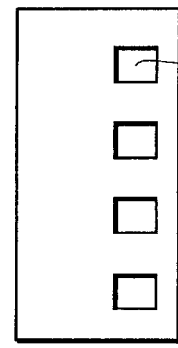

The fourth embodiment is shown in FIG. 5. In this embodiment, a field control electrode 9 takes a varied shape. FIGS. 5(a) and (b) each show a field control electrode 9 with the edge section on the drain side in the shape of a comb and FIG. 5(c) shows a field control electrode 9 with a plurality of openings in the edge section on the drain side. In any form, the area of electrode S in Equation (3)

$$C = \epsilon S/d \quad (3)$$

(C: the capacitance, $\epsilon$: the dielectric constant, S: the area of electrode, d: the distance between electrodes) is reduced on the drain side and thereby the electrostatic capacitance per unit area directly under the field control electrode 9 is made smaller on the drain side than on the gate side. This makes the field centralization which develops on a lower end of the gate electrode 5 relax and spread over more effectively as mentioned in the above description for the third embodiment.

Fifth Embodiment

Figure 6:
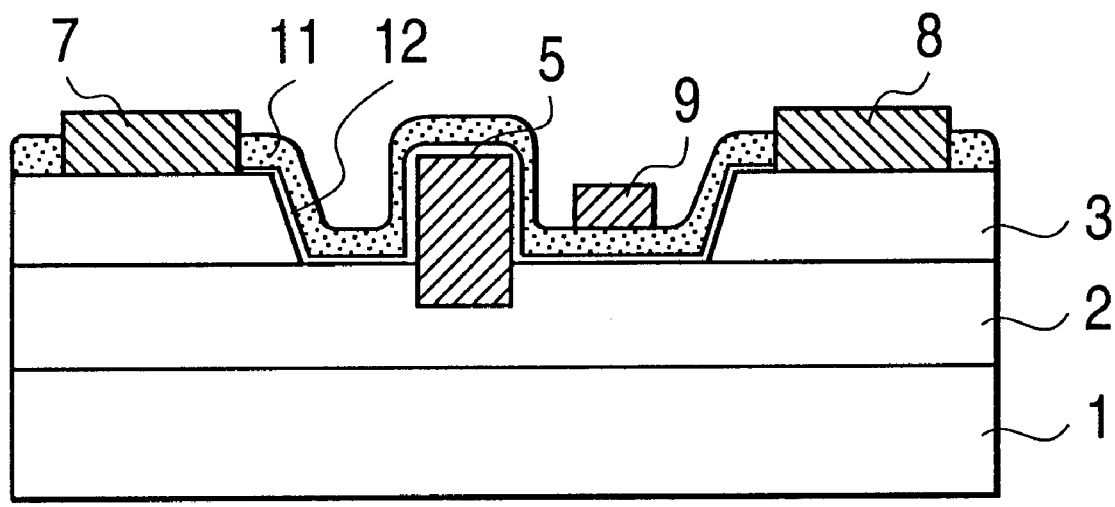
FIG. 6 is a schematic cross-sectional view showing another field effect transistor in accordance with the present invention.

The fifth embodiment is shown in FIG. 6. In this embodiment, a high dielectric film 11 serves as an insulating film directly under a field control electrode 9. As for the material of the high dielectric film 11, it is preferable to use any material selected from the group consisting tantalum oxide ($Ta_2O_5$), strontium titanate ($SrTiO_3$), barium titanate ($BaTiO_3$), barium titanate strontium ($Ba_xSr_{1-x}TiO_3$ (0<x<1)) and bismuth tantalate strontium ($SrBi_2Ta_2O_9$).

Although the high dielectric film 11 is formed over the entire surface of a substrate in the drawing, the high dielectric film 11 may be formed only in a section directly under the field control electrode 9, which can keep down deterioration of high-frequency characteristics of the FET to the minimum.

Sixth Embodiment

Figure 8F:
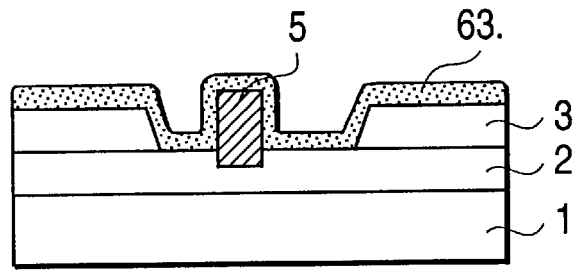
FIG. 8 is schematic cross-sectional views illustrating in sequence the further steps of the manufacturing method of the field effect transistor in accordance with the present invention.
Figure 8G:
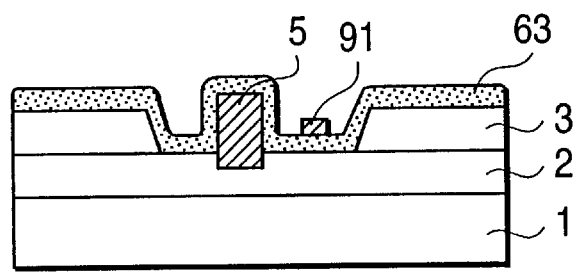
Figure 8H:
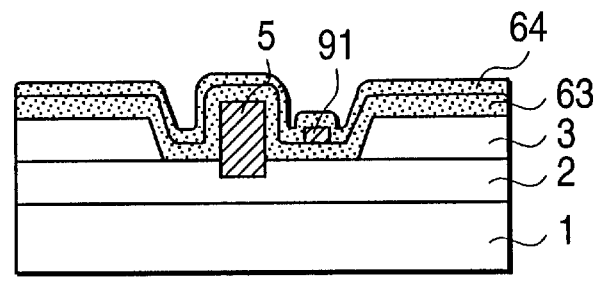
Figure 8I:
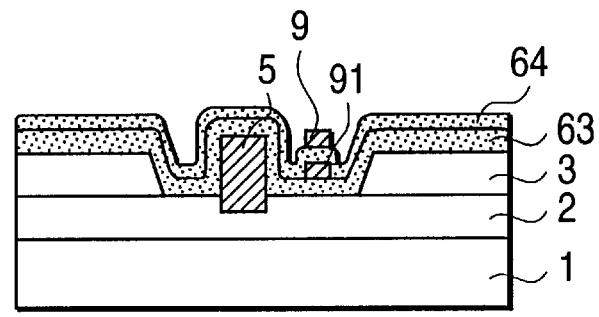

The sixth embodiment is shown in FIG. 8(i). In this embodiment, a float electrode 91 is set below a field control electrode 9. The formation of the float electrode below the field control electrode 9 relaxes and spreads over the field centralization on the edge section of a gate electrode on the drain side even when the applied voltage to the field control electrode is switched off, because electrons are kept in the float electrode 91 when the applied voltage is off.

Seventh Embodiment

Figure 9:
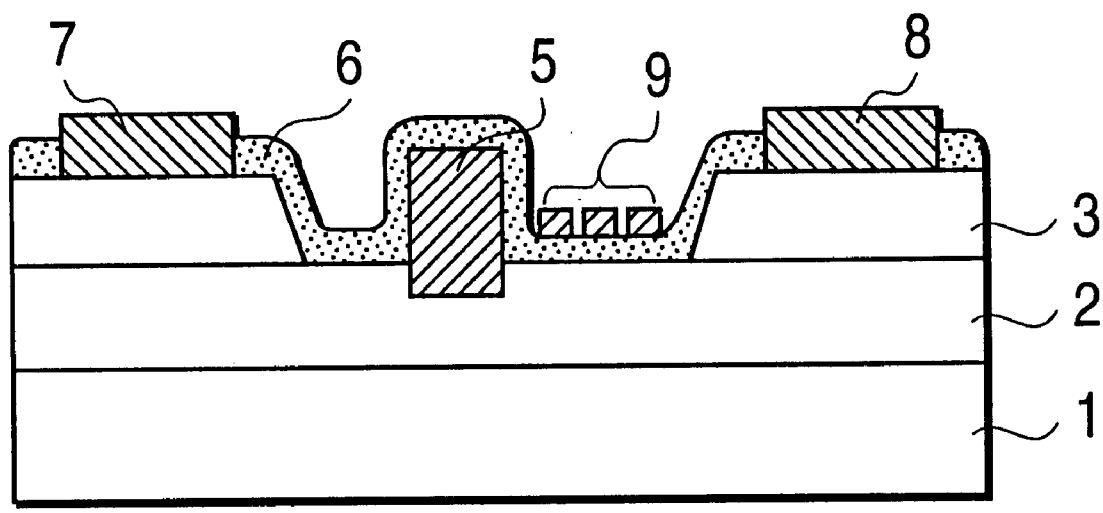
FIG. 9 is a schematic cross-sectional view showing another field effect transistor in accordance with the present invention.

The seventh embodiment is shown in FIG. 9. This embodiment is an example in which a plurality of field control electrodes 9 are set. The formation of a plurality of field control electrodes 9 relaxes and spreads over the field centralization which develops on the edge section of the gate electrode 5 on the drain side more effectively. Voltages applied to respective field control electrodes can be the same or different. For instance, all of the field control electrodes may be connected with the gate electrode and set at the same potential. On the other hand, it may be arranged in such a way that the nearest to the gate electrode among a plurality of those field control electrodes is at the same potential as the gate electrode and a part or all of the rest are at the same potential as a source electrode. This arrangement can reduce the capacitance between the gate and the drain. Further, the voltage applied to a plurality of field control electrodes may be changed dynamically.

Eighth Embodiment

Figure 10:
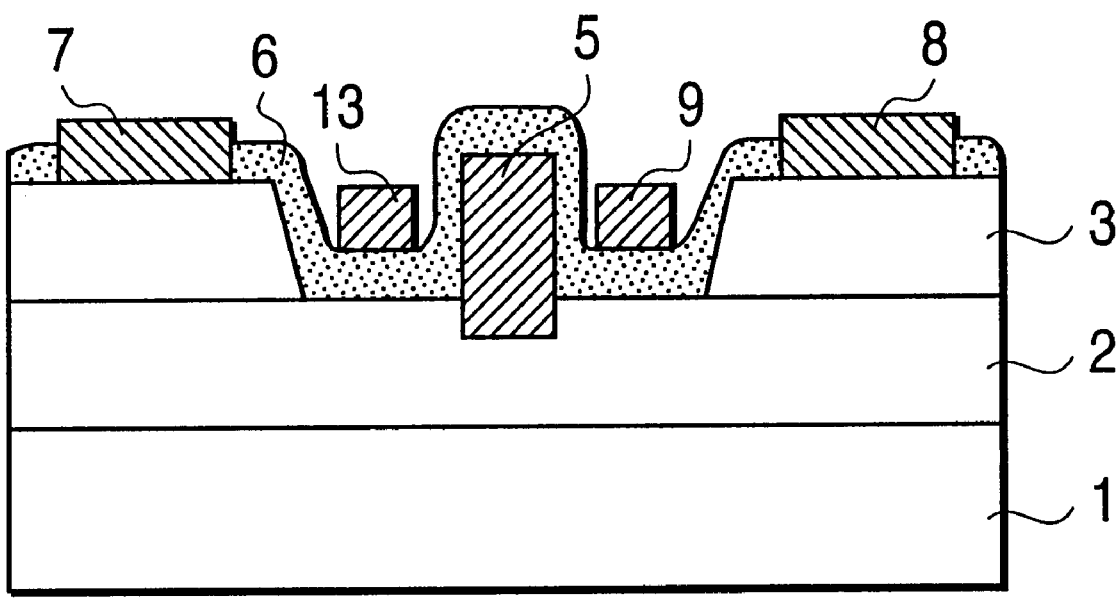
FIG. 10 is a schematic cross-sectional view showing another field effect transistor in accordance with the present invention.

The eighth embodiment is shown in FIG. 10. This embodiment is an example in which a sub electrode 13 is set between a gate electrode 5 and a source electrode 7.

In this embodiment, the field control electrode 9 is connected with the gate electrode 5 and thereby characteristics of withstanding voltage is improved.

Furthermore, the sub electrode 13 is connected with a drain electrode, to which a positive voltage is applied. This lowers the resistance of the area directly under the sub electrode 13 and eases the current flow so that higher efficiency of the element can be achieved.

By setting both the field control electrode 9 and the sub electrode 13 in this way, there can be provided an FET which has a high mutual conductance as well as a low ON-resistance and yet shows excellent characteristics of withstanding voltage. Further, although both a field control electrode and a sub electrode are formed in the present embodiment, a sub electrode may be formed alone. In this case, higher efficiency of the element can be attained.

EXAMPLES

Example 1

The FET of the present example has a recess structure, as shown in FIG. 3(h), wherein a field control electrode 9 is set between a gate electrode 5 and a drain electrode 8. Referring to FIGS. 2 and 3, a method of manufacturing the FET of the present invention is described below.

Figure 2A:
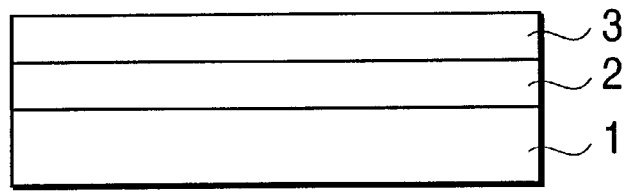
FIG. 2 is schematic cross-sectional views illustrating in sequence the steps of a manufacturing method of the field effect transistor in accordance with the present invention.

First, upon a semi-insulating GaAs substrate 1, an N-type GaAs channel layer 2 (with a thickness of 230 nm) doped with $2 \times 10^{17}$ $cm^{-3}$ Si and an N-type GaAs contact layer 3 (with a thickness of 150 nm) doped with $5 \times 10^{17}$ $cm^{-3}$ Si are grown in succession by the MBE (Molecular Beam Epitaxy) method (FIG. 2(a)).

Figure 2B:
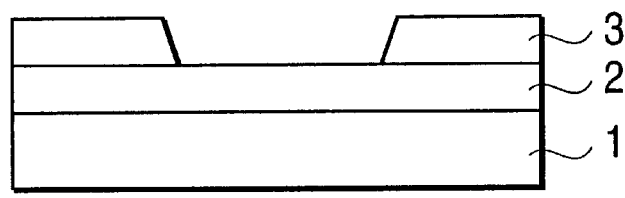

Next, using a resist (not shown in the drawing) as a mask, the contact layer 3 is etched by wet etching with a sulfuric acid based or phosphoric acid based etchant so as to form a recess (FIG. 2(b)).

Figure 2C:
Figure 2D:
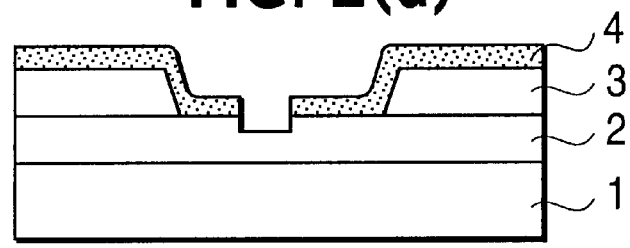
Figure 2E:
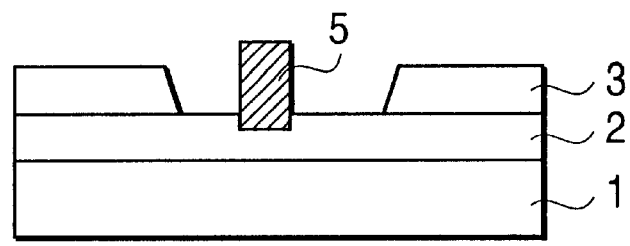

An insulating film 4 of $SiO_2$ is then deposited to a thickness of 200 nm over the entire surface by the CVD (Chemical Vapour Deposition) method and thereafter a portion of the insulating film 4 where a gate electrode is to be formed is etched by dry etching with $CHF_3$ or $SF_6$ (FIG. 2(c)). Next, using the insulating film 4 as a mask, a portion of the channel layer 2 where the gate electrode is to be formed is etched to a depth of 30 nm or so (FIG. 2(d)).

Next, a 100 nm-thick WSi film, a 150 nm-thick TiN film, a 15 nm-thick Pt film, a 400 nm-thick Au film and a 25 nm-thick TiN film are deposited, in this order, over the entire surface by sputtering. After that, a photoresist is applied only to a section thereof where the gate electrode is to be formed, and the other superfluous section is removed by ion-milling, and thereby a gate electrode 5 is formed (FIG. 2(e)).

Next, by the CVD method, an insulating film 6 of $SiO_2$ is deposited to a thickness of 100 nm over the entire surface (FIG. 3(f)). This insulating film 6 protects the semiconductor surface through the whole process of manufacturing the FET and suppresses changes in device characteristics which may take place otherwise at every step of the process.

Next, a field control electrode 9 is formed between a section where a drain electrode is to be formed and the gate electrode 5. First, over the entire surface, a 50 nm-thick Ti film, a 30 nm-thick Pt film and a 200 nm-thick Au film are successively grown in this order by vacuum deposition. A photoresist is then applied to the prescribed section thereof, and the other superfluous section is removed by ion-milling, and thereby a field control electrode 9 is formed (FIG. 3(g)).

Following this, the prescribed sections of the insulating film 6 are etched to expose the contact layer 3 and then an 8 nm-thick Ni film, a 50 nm-thick AuGe film and a 250 nm-thick Au film are successively grown in this order by vacuum deposition and thereby a source electrode 7 and a drain electrode 8 are formed to accomplish an FET (FIG. 3(h)).

Further, while the channel layer 2 and the contact layer 3 are formed by the MBE method in the present example, they may be formed by the MOCVD (Metal Organic Chemical Vapour Deposition) method.

Example 2

The present example is the same FET as the example 1 but the field control electrode 9 in shape varied from that of the example 1 (FIG. 5).

The field control electrodes 9 of various shapes shown in the drawing can be obtained through etching performed into the prescribed form using a photoresist as a mask.

Example 3

The present example utilizes a high dielectric material of $Ta_2O_5$ for an insulating film. Referring to FIG. 6, the present example is described below.

As shown in the drawing, after a low dielectric film 12 of $SiO_2$ is formed at least in a region between a gate and a drain to a thickness of 50 nm by the plasma CVD method, a high dielectric film 11 of $Ta_2O_5$ is formed thereon to a thickness of 200 nm by the sputtering method and thereby the FET of the present example can be manufactured.

With a high dielectric material, the insulating film can have a certain thickness so that breakdown of the insulating film or leakage of the current can be prevented.

Although the high dielectric film 11 is formed over the entire surface in the present example, the high dielectric film 11 may be formed only in a section directly under a field control electrode 9, which can keep down deterioration of high-frequency characteristics to the minimum.

Example 4

In the present example, a sub electrode 13 is set between a gate electrode 5 and a source electrode 7 (FIG. 10). The thickness of an insulating film therein is 100 nm.

Example 5

In the present example, a float electrode is set below a field control electrode 9. Referring to FIGS. 7 and 8, a method of manufacturing the FET of the present invention is described below.

Figure 7A:
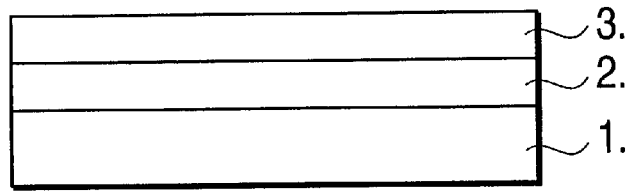
FIG. 7 is schematic cross-sectional views illustrating in sequence the steps of a manufacturing method of the field effect transistor in accordance with the present invention.
Figure 7B:
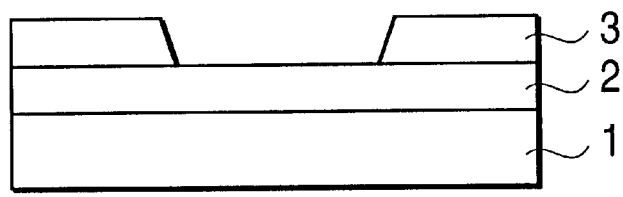
Figure 7C:
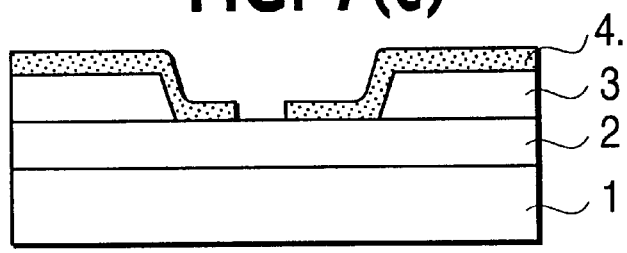
Figure 7D:
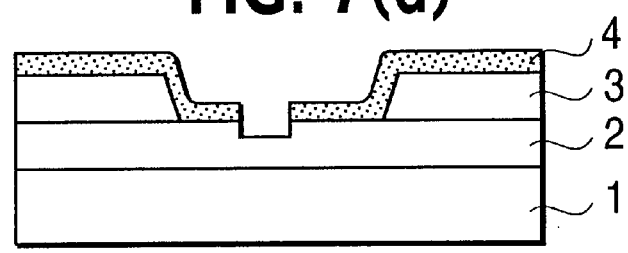
Figure 7E:
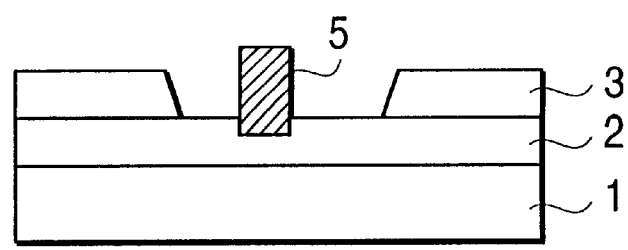

Firstly, as in the first example, a GaAs channel layer 2 (a thickness of 230 nm) and an N-type GaAs contact layer 3 (a thickness of 150 nm) are grown (FIG. 7(a)) and subjected to recess etching (FIG. 7(b)) and thereafter a gate electrode 5 is formed (FIGS. 7(c)~(e)).

Following this, by the plasma CVD method, a lower layer 63 of an insulating film of $SiO_2$ is deposited to a thickness of 30 nm over the entire surface (FIG. 8(f)).

Next, a 30 nm-thick Ti film, a 15 nm-thick Pt film and a 150 nm-thick Au film are successively grown in this order by vacuum deposition. A photoresist is then applied to the prescribed section thereof, and the other superfluous section is removed by ion-milling, and thereby a float electrode 91 is formed. The width of the float electrode 91 in the present example is 0.5 μm (FIG. 8(g)).

Subsequently, an upper layer 64 of the insulating film of $SiO_2$ is deposited to a thickness of 80 nm over the entire surface by the plasma CVD method (FIG. 8(h)).

Next, a field control electrode 9 is formed between a section where a drain electrode is to be formed and the gate electrode 5. First, over the entire surface, a 50 nm-thick Ti film, a 30 nm-thick Pt film and a 200 nm-thick Au film are successively grown in this order by vacuum deposition. A photoresist is then applied to the prescribed section thereof, and the other superfluous section is removed by ion-milling, and thereby a field control electrode 9 is formed (FIG. 8(i)).

Following this, the prescribed sections of the insulating film 6 are etched to expose the contact layer 3 and then an 8 nm-thick Ni film, a 50 nm-thick AuGe film and a 250 nm-thick Au film are successively grown in this order by vacuum deposition and thereby a source electrode 7 and a drain electrode 8 are formed to accomplish an FET.

Example 6

In the present example, a field control electrode 9 is formed to take a stepped shape. The field control electrode in this shape is obtained by forming steps on an insulating film 6 through repeated performance of etching and subsequently growing a metal film thereon by vapour deposition. The thickness of the insulating film 6 is 100 nm for the edge section on the side of a gate electrode and 200 nm for the edge section on the side of a drain electrode.

Example 7

In the present example, a plurality of field control electrodes 9 are set (FIG. 9). Herein the width between a gate electrode and a recess of a contact layer 3 on the drain side is 3 μm and the width of respective field control electrodes is 0.5 μm. The distance between field control electrodes is 0.3 μm.

What is claimed is:

1. A field effect transistor comprising:

a semiconductor substrate with a channel layer being formed on its surface, a source electrode and a drain electrode being formed at a distance on said semiconductor substrate, a gate electrode being placed between said source electrode and said drain electrode, said gate electrode making a Schottky junction with said channel layer, and a field control electrode being formed over an insulating film on said channel layer, between said gate electrode and said drain electrode, said field control electrode not overlapping said gate and drain electrodes.

2. A field effect transistor according to claim 1, wherein the electrostatic capacitance per unit area of a system which consists of said field control electrode, said channel layer and said insulating film sandwiched there between is larger on the side of the gate electrode than on the side of the drain electrode.

3. A field effect transistor according to claim 2, wherein the thickness of said insulating film directly under said field control electrode is less on the side of the gate electrode than on the side of the drain electrode.

4. A field effect transistor according to claim 2, wherein one or more openings are formed in a section of said field control electrode on the side of the drain electrode.

5. A field effect transistor according to claim 2, wherein the edge section of said field control electrode on the side of the drain electrode is comb-shaped.

6. A field effect transistor according to claim 2, wherein the dielectric constant of said insulating film directly under said field control electrode decreases with distance from said gate electrode.

7. A field effect transistor according to claim 1, wherein said insulating film is a high dielectric film selected from the group consisting tantalum oxide ($Ta_2O_5$), strontium titanate ($SrTiO_3$), barium titanate ($BaTiO_3$), barium titanate strontium ($Ba_xSr_{1-x}TiO_3$ ($0<x<1$)) and bismuth tantalate strontium ($SrBi_2Ta_2O_9$).

8. A field effect transistor according to claim 1, wherein a float electrode is set under said field control electrode.

9. A field effect transistor according to claim 1, wherein a plurality of said field control electrodes are set.

10. A field effect transistor according to claim 9, wherein a plurality of said field control electrodes are set and the dielectric constants of the insulating film directly under respective field control electrodes decrease with distance from the side of said gate electrode.

11. A field effect transistor according to claim 1, wherein a sub electrode is set, in addition, over the insulating film on said channel layer, between said gate electrode and said source electrode.

12. A field effect transistor according to claim 1, wherein the distance between said gate electrode and said drain electrode is longer than the distance between said gate electrode and said source electrode.

13. A field effect transistor according to claim 1, which has a recess structure.

14. A field effect transistor according to claim 1, wherein said channel layer is made of a group III–V compound semiconductor.

15. A field effect transistor according to claim 1, which is formed as an amplifier circuit or an oscillation circuit.

16. A field effect transistor comprising:
   a semiconductor substrate with a channel layer being formed on its surface,
   a source electrode and a drain electrode being formed at a distance on said semiconductor substrate,
   a gate electrode being placed between said source electrode and said drain electrode, said gate electrode making a Schottky junction with said channel layer, and
   a sub electrode being formed over an insulating film on said channel layer, between said gate electrode and said source electrode, said sub electrode not overlapping said gate and source electrodes.

17. A field effect transistor according to claim 16, wherein the distance between said gate electrode and said drain electrode is longer than the distance between said gate electrode and said source electrode.

18. A field effect transistor according to claim 16, which has a recess structure.

19. A field effect transistor according to claim 16, wherein said channel layer is made of a group III–V compound semiconductor.

20. A field effect transistor according to claim 16, which is formed as an amplifier circuit or an oscillation circuit.

* * * * *